Dec. 23, 1969 TOSHIRO SAKAMOTO 3,486,082

SEMICONDUCTOR DEVICES

Filed March 6, 1968 2 Sheets-Sheet 1

INVENTOR:
TOSHIRO SAKAMOTO

BY Stephen H. Frishauf
Atty

United States Patent Office 3,486,082

Patented Dec. 23, 1969

3,486,082

SEMICONDUCTOR DEVICES

Toshiro Sakamoto, Yokohama-shi, Japan, assignor to Tokyo-Shibaura Electric Co., Ltd., Kawasaki-shi, Japan, a corporation of Japan Filed Mar. 6, 1968, Ser. No. 711,027
Claims priority, application Japan, Mar. 9, 1967 (utility model), 42/19,268
Int. Cl. H01l 3/00, 5/00, 11/00
U.S. Cl. 317—234 10 Claims

ABSTRACT OF THE DISCLOSURE

In a semiconductor device, particularly in a high frequency transistor adapted to be used in an emitter grounded scheme, the length of an emitter connecting wire for interconnecting an emitter contact and an emitter lead is reduced to less than about one half of the length of a base connecting wire that interconnects a base contact and a base lead whereby to decrease the emitter inductance.

This invention relates to a semiconductor device and more particularly to a high frequency transistor.

In one type of a high frequency transistor, a transistor element, for example, a planar transistor element is arranged at the central portion of a metal substrate in the form of a circular disc. This type of transistor comprises a collector region directly soldered to the substrate, a base region within the collector region, an emitter region formed on the surface of a portion of the base region and a base contact and an emitter contact respectively mounted on the surface of said base region and emitter region.

Further an emitter lead and a base lead, spaced each other by a predetermined spacing, are secured to the periphery of the substrate.

Said leads are equally spaced from the transistor element for improving the efficiency of assembling operation. One group of the base contact and base lead, and another group of the emitter contact and emitter lead are respectively electrically interconnected by connecting wires of equal length. Transistors for high frequency applications are generally used in the so-called emitter grounded scheme wherein the emitter lead is directly grounded without utilizing any external resistor. In the emitter grounded scheme for high frequency applications there is not any substantial trouble because the base and collector are connected to tuning circuits. However the effect of inductance caused by the emitter connecting wire can not be ignored.

For example, in a high frequency power transistor of the emitter grounded type the power gain (PG) can be shown by the following equation $$PG=\left(\frac{f_T}{f}\right)2\cdot\frac{R_L}{r_{bb'}+\omega_T L_E} \quad (1)$$

where $R_L$ represents the load resistance, $r_{bb}'$ the base resistance, $L_E$ the emitter inductance, $f$ the frequency used, $f_T$ the transition frequency at which the absolute value of current amplification factor of the emitter grounded transistor becomes equal to unity, and $\omega_T$ the transition angular frequency of $\omega_T=2\pi f_T$.

As the above equation clearly shows the power gain decreases as the emitter inductance $L_E$ increases. As understood from the equation given below, emitter inductance can be determined as a function of the diameter and length of the emitter connecting wire, and increases substantially with the increase in the length of the wire. The increase in the diameter effects a negligible variation in the inductance, when compared with the increase in the length.

$$L_E=0.002l\left[2.3\log_{10}\left(\frac{4l}{d}-1\right)+\frac{1}{4}\right]\times10^{-6}\text{ henry} \quad (2)$$

where $l$ and $d$ represent respectively the length and diameter of the emitter connecting wire.

In the transistor having the above described construction, the emitter connecting wire as well as the base connecting wire usually has a diameter of 50 microns and a length of more than 2 mm. Accordingly, where the transistor is utilized in the emitter grounded scheme, the inductance of the emitter connecting wire amounts to more than 1.6 m$\mu$H. at a frequency of $f=175$ mHz., thus greatly influencing the output characteristics, as can be clearly understood from the foregoing equation.

An object of the invention is to provide a transistor device consisting of a metallic substrate, a transistor element disposed on the substrate and having a collector, an emitter and a base region, an emitter and a base lead which are attached apart from said elemennt to said substrate and which are electrically connected to said emitter and base regions respectively through an emitter and a base wire, said emitter wire being less than half said base wire in length so that the device is superior to prior art in power gain.

Figure 1:
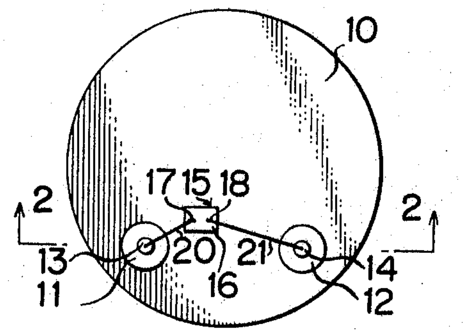
FIG. 1 is a schematic plan view of one embodiment according to the invention.
Figure 2:
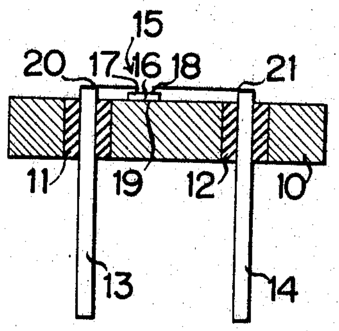
FIG. 2 is a section taken substantially along the line 2—2 shown in FIG. 1.

Referring now to the accompanying drawings, in FIG. 1 and 2 there is shown a semiconductor device comprising a metal substrate 10 in the form of a circular disc and provided with two spaced apart perforations near the periphery of the disc, and an emitter lead 13 and a base lead 14 extending through electric insulators 11 and 12, respectively secured in said perforations. A high frequency power transistor element, for example, a planar transistor element 15 is secured to the upper surface of the substrate 10 near its center.

Figures 3, 6:
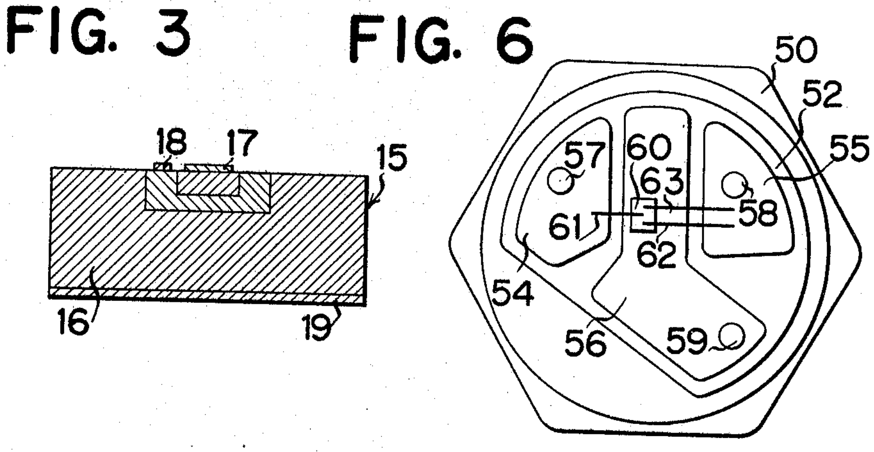
FIG. 3 shows an enlarged section of a planar transistor element used in the embodiments according to the invention.
FIG. 6 is a plan view showing a further embodiment according to the invention.

In one form of the planar transistor element 15 as enlargedly shown in FIG. 3, a base region and an emitter region are formed by diffusion in a semiconductor body 16, and contacts 17 and 18 are mounted on the respective regions. These contacts are mounted on one surface of the semiconductor body 16 while a collector contact 19 is mounted on the other surface thereof.

It is not always necessary to provide the collector contact 19 and such contact may be substituted by the surface of the collector region so that the term "contact" herein used is intended to include not only the surface of the region formed on the semiconductor body but also the ohmic electrode secured to such surface.

The transistor element 15 is placed on the substrate 10 with its lower surface or the side including the collector contact 19 contacted with the upper surface of the substrate 10 while emitter electrode 17 and base contact 18 are placed on the upper surface of the transistor element 15.

Emitter contact 17 and emitter lead 13 are electrically interconnected by an emitter connecting wire 20. Likewise base contact 18 and base lead 14 are electrically interconnected by a base connecting wire 21. According to this invention it is essential to make the length of the emitter connecting wire 20 to be less than about one half of the length of the base connecting wire 21. In this embodiment a wire of about 50 microns diameter was used and the length of the emitter connecting wire 20 was selected to be about 0.7 mm. while that of the base connecting wire to be about 3.3 mm.

The spacing between the emitter lead 13 and the base wire 14 was designed to be about 3 mm. to provide certain degree of allowance to the connecting wires. The emitter inductance during the operation of the semiconductor device constructed as above described was measured to be about 0.8 m$\mu$H.

Figure 4:
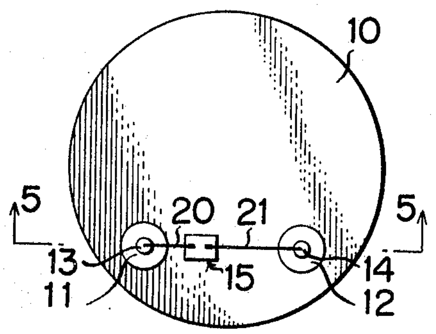
FIG. 4 is a schematic plan view showing another embodiment according to the invention.
Figure 5:
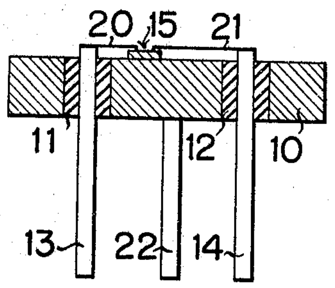
FIG. 5 is a section taken substantially along the line 5—5 shown in FIG. 4.

FIG. 4 shows another embodiment of this invention and FIG. 5 shows its cross-section. In these figures portions corresponding to those shown in FIGS. 1 and 2 are designated by the same reference numerals. This modification is different from the previous embodiment in that the transistor element 15 is disposed in alignment with the emitter lead 13 and the base lead 14 and that a collector lead 22 is connected to the substrate 10. By arranging the transistor as shown in FIG. 5 it is possible to decrease the length of the emitter connecting wire 20 without increasing the length of the base connecting wire 20.

Again, the length of the emitter connecting wire was selected to be about 0.7 mm. and that of the base connecting wire to be about 3.3 mm. Accordingly, the emitter inductance during the operation of the semiconductor device was about 0.8 m$\mu$H.

Figures 7, 8, 10:
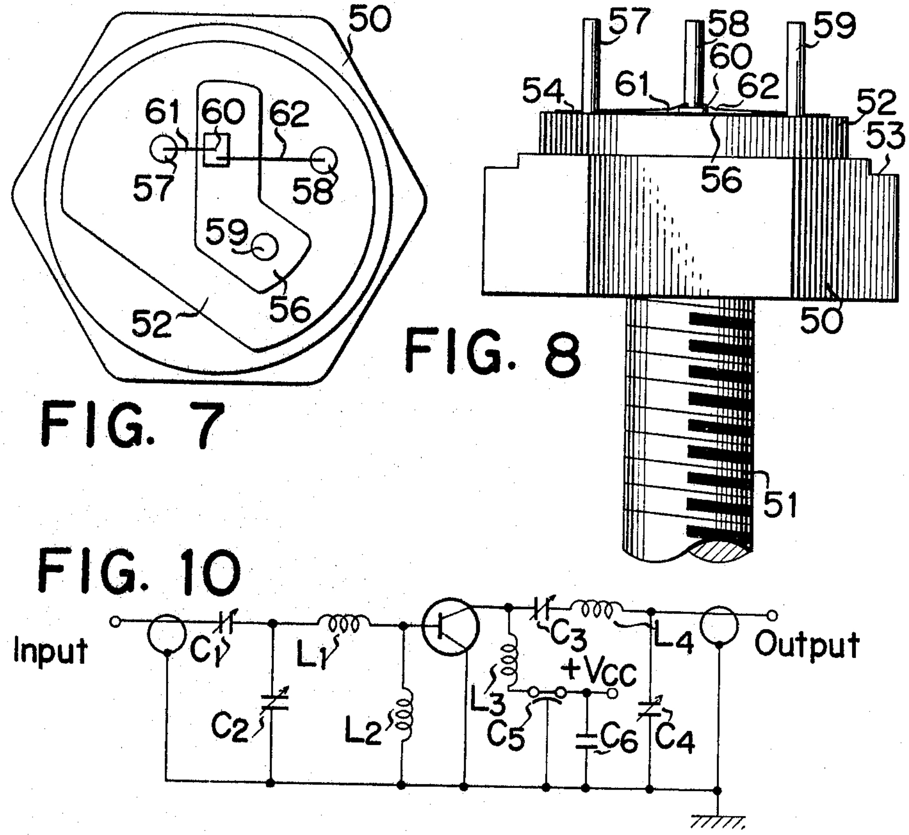
FIG. 7 is an elevational view of the device shown in FIG. 5.
FIG. 8 is a plan view showing a further embodiment according to the invention.
FIG. 10 is an electric circuit used for measurement of the transistor device according to the invention.

Another embodiment of this invention is shown in FIGS. 6 and 7. FIG. 6 is a plan view while FIG. 7 is a side view of this modification. As shown in FIG. 6 a threaded stud 51 is secured to the lower surface of a supporting member 50 of heat conductor such as copper and a disc shaped substrate 52 made of a suitable electric insulating and heat conductive substrate such as beryllium oxide is secured on the upper surface of the supporting member. The supporting member 50 has a hexagonal cross-section and is formed with a shoulder 53 on its upper periphery to receive a lid, not shown.

On the upper surface of the substrate 52 are formed a first thin metal film 54, a second thin metal film 55 and a third thin metal film 56 which are made of aluminum, for example, and are spaced apart from each other. An emitter lead 57, a base lead 58 and a collector lead 59 are electrically secured to the first, second and third thin metal film 54, 55 and 56 respectively.

On the third thin metal film 56 is mounted a high frequency power transistor element, for example, a planar transistor element 60 with its collector contact contacted with the thin metal film. The emitter contact of the transistor element 60 and the first thin film 54 are electrically connected by an emitter connecting wire 61. Similarly, the base contact and the second thin metal film 55 are electrically connected by base connecting wires 62 and 63.

The length of the emitter connecting wires 61 is made to be less than about one half of that of the base connecting wires 62 and 63. In this embodiment the length of the emitter connecting wire 61 and base connecting wires 62 and 63 were about 0.9 mm. and about 3.1 mm. respectively.

FIG. 8 shows a modification of the embodiment shown in FIGS. 6 and 7. This modification is different from that in FIG. 6 in that the first and second thin metal films are not employed.

Accordingly, the emitter connecting wire 61 connects the emitter contact of the transistor element 60 directly to the emitter lead 57 and the base connecting wire connects the base contact to the base lead 58. The length of the emitter connecting wire 61 and the base connecting wire 62 is substantially the same as in the embodiment of FIG. 6.

Figure 9:
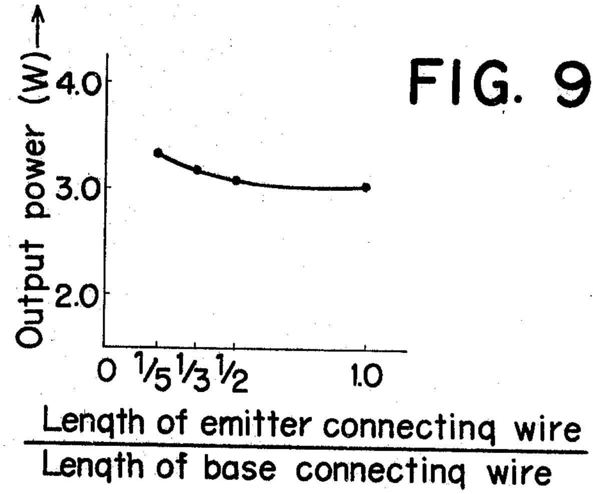
FIG. 9 is a graph to show the relation between the lengths of the connecting wires and the output voltages.

FIG. 9 is a graph to show the relationship between a ratio length of the base connecting wire/the length of the emitter connecting wire and the output power when an emitter grounded high frequency power transistor is used as a C class amplifier at a frequency of 175 mHz. In this case, the sum of the length of the emitter connecting wire and that of the base connecting wire equals to about 4.0 mm.

FIG. 10 shows a conventional circuit utilized to measure the data plotted in FIG. 9. As can be noted from FIG. 9, when the lengths of the emitter connecting wire and of the base connecting wire are selected to be 0.7 mm. and 3.3 mm. respectively, an output power of about 3.3 w. is obtained. On the other hand, where the lengths of these connecting wires are selected to be substantially equal as in the conventional device the output power is only about 3 w. Thus, according to this invention it becomes possible to prevent decrease in the output power due to the effect of the emitter inductance and hence to increase the output power by more than 10%. This invention is especially effective for semiconductor devices having an $f_T$ of more than 10 mHz.

However, it is to be understood that this invention is not limited to the emitter grounded type semiconductor devices. The semiconductor devices can also be used with other grounding schemata, such as base grounded scheme, because the effect of base inductance is negligible owing to very small base current.

Further, the transistor elements and leads illustrated in the above described embodiments are not necessarily located around the stem but they may be located at any portion of the stem.

While the invention has been described in connection with preferred embodiment thereof, it will be obvious to those skilled in the art that various changes and modifications may be made therein without departing from the scope of the invention, and it is aimed, therefore, to cover in the appended claims all such changes and modifications as fall within the true spirit and scope of the invention.

What is claimed is:

1. A semiconductor device comprising a substrate of metal; a high frequency transistor element mounted on said substrtate, and having an emitter, a base and a collector region, an emitter lead and a base lead spaced apart from each other and extending through said substrate and electrically insulated therefrom, an emitter contact and a base contact formed on one surface of said transistor element and a collector contact formed on the other surface of said transistor element, said transistor element being mounted on said substrate with said collector contact in contact therewtih; a base connecting wire electrically interconnecting said base contact and said base lead; and an emitter connecting wire electrically interconnecting said emitter contact and said emitter lead, said emitter connecting wire having a length less than about one half of that of said base connecting wire.

2. A semiconductor device according to claim 1 wherein said transistor element is located on a straight line that interconnects said emitter lead and said base lead at a point closer to said emitter lead than said base lead.

3. A semiconductor device according to claim 1 wherein said emitter lead and said base lead extend through said substrate via electric insulators and wherein said substrate is utilized as a collector terminal.

4. A semiconductor device according to claim 1 wherein said collector lead is separated from said emitter lead and said base lead and is ohmically secured to said substrate.

5. A semiconductor device according to claim 1 wherein said semiconductor device is utilized in an emitter grounded scheme.

6. A semiconductor device comprising a metallic supporting member; a heat conductive and electrically insulative substrate mounted on said supporting member; a high frequency transistor element having an emitter, a base and a collector region, an emitter lead, a base lead and a collector lead spaced apart from one another and mounted on said substrate, a thin metal film formed on said substrate in contact with said collector lead, an emitter contact and a base contact formed on one surface of said transistor element, and a collector contact formed on the other surface of said transistor element, said transistor element being mounted on said substrate with collector contact in contact with said thin metal film; a base connecting wire electrically interconnecting said base contact and said base lead; and an emitter connecting wire electrically interconnecting said emitter contact and said emitter lead, the length of said emitter connecting wire being less than about one half of that of said base connecting wire.

7. A semiconductor device comprising a metallic supporting member, a heat conducting and electric insulating substrate, spaced apart first, second and third thin metal films formed on said substrate, an emitter lead mounted upon said substrate in contact with said first thin metal film, a base lead mounted upon said substrate in contact with said second thin metal film, a collector lead mounted upon said substrate in contact with said third thin metal film, a high frequency transistor element including an emitter region, a base region, a collector region, an emitter contact and a base contact formed on one surface of said transistor element and a collector region formed on the other surface of said transistor element, said transistor element being mounted on said substrate with said collector contact in contact with said third thin metal film; a base connecting wire electrically interconnecting said base contact with said thin metal contact; and an emitter connecting wire electrically interconnecting said emitter contact and said first thin metal film, said emitter connecting wire having a length less than about one half of that of said connecting wire.

8. A semiconductor device according to claim 7 wherein said transistor element is mounted on said third thin metal film at a point on a straight line interconnecting said emitter lead and said base lead, said point being closer to said emitter lead than said base lead.

9. A semiconductor device according to claim 7 wherein said semiconductor device is utilized in an emitter grounded scheme.

10. A semiconductor device according to claim 7 wherein a threaded stud is secured to said metal supporting member on one surface thereof different from the surface which supports said substrate.

References Cited

UNITED STATES PATENTS

| | | | |
|---|---|---|---|
| 2,817,048 | 12/1957 | Thuermel et al. | 317—234 |
| 3,325,704 | 6/1967 | Belasco et al. | 317—234 |
| 3,339,127 | 8/1967 | Darter et al. | 317—234 |
| 3,387,190 | 6/1968 | Winkler | 317—234 |

JAMES D. KALLAM, Primary Examiner

R. F. POLISSACK, Assistant Examiner

U.S. CL. X.R.

317—235; 174—52